United States Patent
Lim et al.

(10) Patent No.: US 11,842,779 B2
(45) Date of Patent: Dec. 12, 2023

(54) MEMORY DEVICE AND OPERATING METHOD FOR PERFORMING VERIFY OPERATION

(71) Applicant: SK hynix Inc., Icheon-si (KR)

(72) Inventors: Sung Yong Lim, Icheon-si (KR); Jae Il Tak, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 148 days.

(21) Appl. No.: 17/513,612

(22) Filed: Oct. 28, 2021

(65) Prior Publication Data
US 2022/0375533 A1 Nov. 24, 2022

(30) Foreign Application Priority Data
May 21, 2021 (KR) .................. 10-2021-0065794

(51) Int. Cl.
| G11C 11/04 | (2006.01) |
| G11C 16/34 | (2006.01) |
| G11C 11/56 | (2006.01) |
| G11C 16/10 | (2006.01) |
| G11C 16/04 | (2006.01) |

(52) U.S. Cl.
CPC ...... G11C 16/3459 (2013.01); G11C 11/5628 (2013.01); G11C 11/5671 (2013.01); G11C 16/0483 (2013.01); G11C 16/10 (2013.01)

(58) Field of Classification Search
CPC ............ G11C 16/3459; G11C 11/5628; G11C 11/5671; G11C 16/0483; G11C 16/10; G11C 16/24; G11C 2211/5621; G11C 16/32; G11C 16/3404; Y02D 10/00
USPC ....................................................... 365/185.03
See application file for complete search history.

(56) References Cited

U.S. PATENT DOCUMENTS

| 10,249,383 B2 * | 4/2019 | Han .................. G11C 16/26 |
| 11,114,173 B2 * | 9/2021 | Lee .................. G11C 16/0483 |
| 2019/0355408 A1 * | 11/2019 | Shin .................. G11C 11/4094 |

FOREIGN PATENT DOCUMENTS

| KR | 101184866 B1 | 9/2012 |
| KR | 1020170020658 A | 2/2017 |

* cited by examiner

*Primary Examiner* — Tha-O H Bui
(74) *Attorney, Agent, or Firm* — WILLIAM PARK & ASSOCIATES LTD.

(57) ABSTRACT

A memory device includes a memory block, a peripheral circuit, and control logic. The memory block includes memory cells. The peripheral circuit performs a program operation including a plurality of program loops. Each of the plurality of program loops includes a program pulse application operation and a verify operation. The control logic controls the peripheral circuit to store cell status information and apply a program limit voltage. The control logic sets a verify pass reference and applies the program limit voltage determined based on the cell status information.

20 Claims, 15 Drawing Sheets

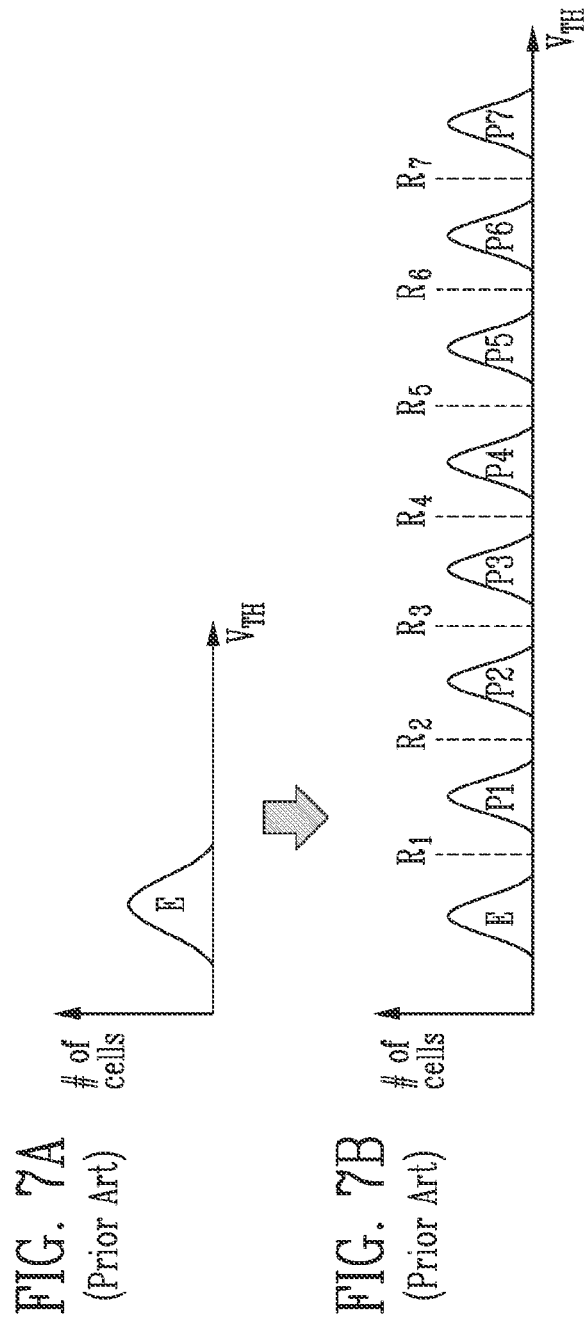

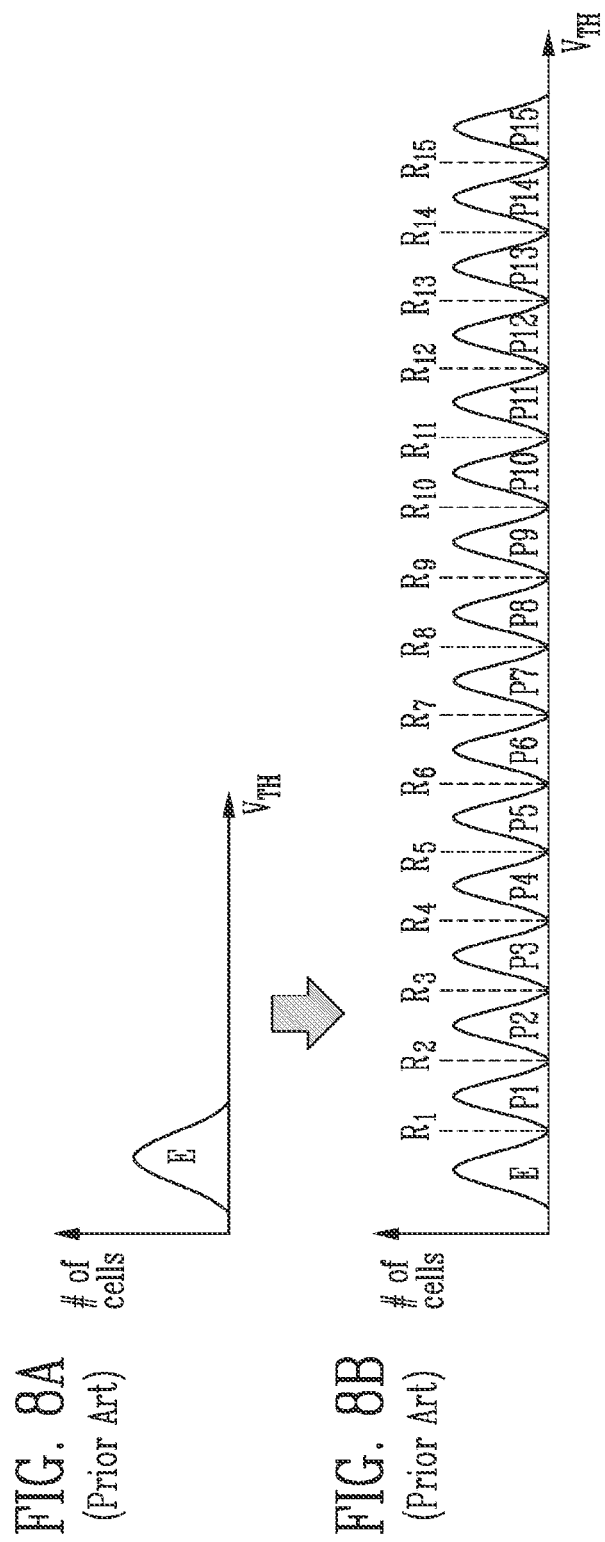

| PGM Pulse | Verify | Cell Status Information | | | CSC Check |
|---|---|---|---|---|---|
| | | PGM Cell | DPGM Cell | Inhibit Cell | |
| N-3 | O | #0~#100 | #101~#200 | #201~#300 | FAIL |
| N-2 | O | #0~50 | #51~#150 | #151~#300 | PASS |
| N-1 | No verify | #0~30 | #31~#70 | #71~#300 | NO CSC |
| N | No verify | | #0~30 | #31~#300 | NO CSC |

MEMORY DEVICE AND OPERATING METHOD FOR PERFORMING VERIFY OPERATION

CROSS-REFERENCE TO RELATED APPLICATION

The present application claims priority under 35 U.S.C. § 119(a) to Korean patent application number 10-2021-0065794, filed on May 21, 2021, in the Korean Intellectual Property Office, the entire disclosure of which is incorporated herein by reference.

BACKGROUND

1. Technical Field

The present disclosure generally relates to an electronic device, and more particularly, to a memory device and an operating method thereof.

2. Related Art

A storage device is a device which stores data under the control of a host device such as a computer or a smart phone. The storage device may include a memory device for storing data and a memory controller for controlling the memory device. The memory device is classified as a volatile memory device or a nonvolatile memory device.

A volatile memory device is a memory device in which data is stored only when power is supplied, and stored data is lost when the supply of power is interrupted. A volatile memory device may include Static Random Access Memory (SRAM), Dynamic Random Access Memory (DRAM), and the like.

A nonvolatile memory device is a memory device in which data is not lost even when supply of power is interrupted. A nonvolatile memory device may include Read Only Memory (ROM), Programmable ROM (PROM), Electrically Programmable ROM (EPROM), Electrically Erasable ROM (EEROM), flash memory, and the like.

SUMMARY

Various embodiments provide a memory device having an improved operation speed, and an operating method of the memory device.

In accordance with an embodiment of the present disclosure, a memory device includes: a memory block including memory cells; a peripheral circuit configured to perform a program operation including a plurality of program loops each including a program pulse application operation of increasing threshold voltages of the memory cells and a verify operation of verifying whether the threshold voltages of the memory cells have reached a target threshold voltage; and control logic configured to control the peripheral circuit to perform the program operation. The peripheral circuit outputs a verify pass signal, corresponding to that a number of memory cells for which the threshold voltages have reached the target threshold voltage among the memory cells is equal to or greater than that determined by a verify pass reference. The control logic: sets the verify pass reference such that the threshold voltages of the memory cells reach the target threshold voltage in an Nth program loop among the plurality of program loops, and the verify pass signal is received in an (N−2)th program loop; stores cell status information representing a program state of each of the memory cells, corresponding to a verify operation included in the (N−2)th program loop; and applies a program limit voltage to each bit line of the memory cells in a program pulse application operation of each of an (N−1)th program loop and the Nth program loop, based on the stored cell status information.

In accordance with another embodiment of the present disclosure, a memory device includes: a memory block including memory cells; a peripheral circuit configured to perform a program operation including a plurality of program loops, wherein each of the plurality of program loops includes a program pulse application operation of increasing threshold voltages of the memory cells by applying a program pulse and a verify operation of verifying whether the threshold voltages of the memory cells have reached a target threshold voltage; and control logic configured to control the peripheral circuit to store cell status information representing a program state of each of the memory cells, corresponding to the verify operation, and apply a program limit voltage to each bit line of the memory cells according to the cell status information in the program pulse application operation. The control logic: sets a verify pass reference such that the threshold voltages of the memory cells reach the target threshold voltage in a program loop performed secondly from a program loop in which a verify pass signal of the verify operation is received; and applies the program limit voltage determined based on the cell status information stored when the verify pass signal is received at each bit line of the memory cells from a next program loop of the program loop in which the verify pass signal is received to the program loop in which the threshold voltages of the memory cells reach the target threshold voltage.

In accordance with still another embodiment of the present disclosure, a method for operating a memory device including a memory block including memory cells, a peripheral circuit for performing a program operation including a plurality of program loops, and control logic for controlling the peripheral circuit to apply a program limit voltage to each bit line of the memory cells, corresponding to the program operation, wherein each of the plurality of program loops includes a program pulse application operation and a verify operation, and wherein the method includes: setting a verify pass reference such that threshold voltages of the memory cells reach the target threshold voltage in an Nth program loop among the plurality of program loops, and a verify pass signal is received in an (N−2)th program loop; storing cell status information representing a program state of each of the memory cells, corresponding to a verify operation included in the (N−2)th program loop; and applying a program limit voltage to each bit line of the memory cells in a program pulse application operation of each of an (N−1)th program loop and the Nth program loop, based on the stored cell status information.

BRIEF DESCRIPTION OF THE DRAWINGS

Example embodiments will now be described more fully hereinafter with reference to the accompanying drawings; however, they may be embodied in different forms and should not be construed as being limited to the embodiments set forth herein. Rather, these embodiments are provided so that this disclosure will be enabling to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

FIGS. 7A and 7B are diagrams illustrating a threshold voltage distribution of a triple level cell.

FIGS. 8A and 8B are diagrams illustrating a threshold voltage distribution of a quad level cell.

DETAILED DESCRIPTION

The specific structural or functional description disclosed herein is merely illustrative for the purpose of describing embodiments according to the concept of the present disclosure. The embodiments according to the concept of the present disclosure can be implemented in various forms, and cannot be construed as limited to the embodiments set forth herein.

Figure 1:
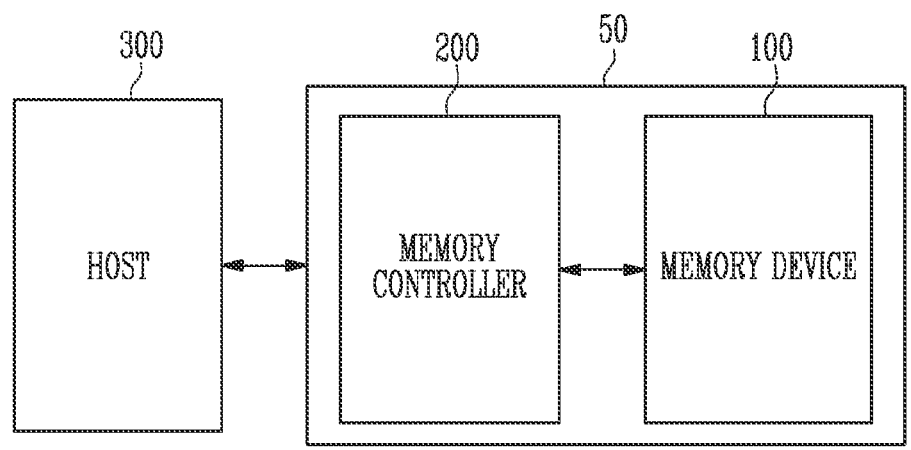
FIG. 1 is a diagram illustrating a storage device including a memory device in accordance with an embodiment of the present disclosure.

FIG. 1 is a diagram illustrating a storage device 50 including a memory device in accordance with an embodiment of the present disclosure.

Referring to FIG. 1, the storage device 50 may include a memory device 100 and a memory controller 200 for controlling an operation of the memory device 100. The storage device 50 may be a device for storing data under the control of a host 300, such as a mobile phone, a smart phone, an MP3 player, a laptop computer, a desktop computer, a game console, a TV, a tablet PC, or an in-vehicle infotainment system.

The storage device 50 may be manufactured as any one of various types of storage devices according to a host interface that is a communication scheme with the host 300. For example, the storage device 50 may be implemented as any one of a variety of types of storage devices, such as a Solid State Drive (SSD), a Multi-Media Card (MMC), an Embedded MMC (eMMC), a Reduced Size MMC (RS-MMC), a micro-MMC (micro-MMC), a Secure Digital (SD) card, a mini-SD card, a micro-SD card, a Universal Serial Bus (USB) storage device, a Universal Flash Storage (UFS) device, a Compact Flash (CF) card, a Smart Media Card (SMC), a memory stick, and the like.

The storage device 50 may be manufactured as any one of various kinds of package types. For example, the storage device 50 may be manufactured as any one of various kinds of package types such as a Package-On-Package (POP), a System-In-Package (SIP), a System-On-Chip (SOC), a Multi-Chip Package (MCP), a Chip-On-Board (COB), a Wafer-level Fabricated Package (WFP), and a Wafer-level Stack Package (WSP).

The memory device 100 may store data. The memory device 100 may operate under the control of the memory controller 200. The memory device 100 may include a memory cell array (not shown) including a plurality of memory cells for storing data.

Each of the memory cells may be configured as any one of a Single-Level Cell (SLC) storing one data bit, a Multi-Level Cell (MLC) storing two data bits, a Triple-Level Cell (TLC) storing three data bits, or a Quadruple-Level Cell (QLC) storing four data bits.

The memory cell array (not shown) may include a plurality of memory blocks. Each memory block may include a plurality of memory cells. One memory block may include a plurality of pages. In an embodiment, the page may be a unit for storing data in the memory device 100 or reading data stored in the memory device 100. The memory block may be a unit for erasing data.

In an embodiment, the memory device 100 may include Double Data Rate Synchronous Dynamic Random Access Memory (DDR SDRAM), Low Power Double Data Rate 4 (LPDDR4) SDRAM, Graphics Double Data Rate (GDDR) SRAM, Low Power DDR (LPDDR), Rambus Dynamic Random Access Memory (RDRAM), NAND flash memory, vertical NAND flash memory, NOR flash memory, Resistive Random Access Memory (RRAM), Phase-Change Random Access Memory (PRAM), Magnetoresistive Random Access Memory (MRAM), Ferroelectric Random Access Memory (FRAM), Spin Transfer Torque Random Access Memory (STT-RAM), or the like. In this specification, for convenience of description, a case where the memory device 100 includes NAND flash memory is assumed and described.

The memory device 100 may receive a command CMD and an address ADDR from the memory controller 200, and access an area selected by the address ADDR in the memory cell array. The memory device 100 may perform an operation indicated by the command CMD on the area selected by the address ADDR. For example, the memory device 100 may perform a write operation (program operation), a read operation, or an erase operation. In the program operation, the memory device 100 may program data in the area selected by the address ADDR. In the read operation, the memory device 100 may read data from the area selected by the address ADDR. In the erase operation, the memory device 100 may erase data stored in the area selected by the address ADDR.

In an embodiment, the memory device 100 may include a plurality of planes. A plane may be a unit capable of independently operating an operation. For example, the memory device 100 may include two, four, or eight planes. Each of the plurality of planes may independently operate a program operation, a read operation, or an erase operation, and the plurality of planes may simultaneously perform each of the program operation, the read operation, and the erase operation.

The memory controller 200 may control overall operations of the storage device 50.

When power is applied to the storage device 50, the memory controller 200 may execute firmware (FW). When the memory device 100 is a flash memory device, the FW may include a host interface layer (HIL) for controlling communication with the host 300, a flash translation layer (FTL) for controlling communication between the host and the memory device 100, and a flash interface layer (FIL) for controlling communication with the memory device 100.

The memory controller 200 may receive write data and a Logical Block Address (LBA) from the host 300, and translate the LBA into a Physical Block Address (PBA) representing addresses of memory cells included in the memory device 100, in which data is to be stored. In this specification, the LBA and a "logic address" or "logical address" may be used with the same meaning. In this specification, the PBA and a "physical address" may be used with the same meaning.

The memory controller 200 may control the memory device 100 to perform a program operation, a read operation, an erase operation, or the like in response to a request from the host 300. In the program operation, the memory controller 200 may provide a program command, a PBA, and data to the memory device 100. In the read operation, the memory controller 200 may provide a read command and a PBA to the memory device 100. In the erase operation, the memory controller 200 may provide an erase command and a PBA to the memory device 100.

In an embodiment, the memory controller 200 may autonomously generate a command, an address, and data regardless of any request from the host 300, and transmit the command, the address, and the data to the memory device 100. For example, the memory controller 200 may provide the memory device 100 with a command, an address, and data, which are used to perform read and program operations accompanied in performing wear leveling, read reclaim, garbage collection, etc.

In an embodiment, the memory controller 200 may control multiple memory devices 100. The memory controller 200 may control the memory devices according to an interleaving scheme so as to improve operational performance. The interleaving scheme may be a scheme for controlling operations on the multiple memory devices 100 to overlap with each other. Alternatively, the interleaving scheme may be a scheme in which the multiple memory devices 100 operate in parallel to each other.

A buffer memory (not shown) may temporarily store data provided from the host 300, i.e., data to be stored in the memory device 100, or temporarily store data read from the memory device 100. In an embodiment, the buffer memory (not shown) may be a nonvolatile memory device. For example, the buffer memory (not shown) may include Dynamic Random Access Memory (DRAM) or a Static Random Access Memory (SRAM).

The host 300 may communicate with the storage device 50, using at least one of various communication manners, such as a Universal Serial bus (USB), a Serial AT Attachment (SATA), a High Speed InterChip (HSIC), a Small Computer System Interface (SCSI), Firewire, a Peripheral Component Interconnection (PCI), a PCI express (PCIe), a Non-Volatile Memory express (NVMe), a universal flash storage (UFS), a Secure Digital (SD), a Multi-Media Card (MMC), an embedded MMC (eMMC), a Dual In-line Memory Module (DIMM), a Registered DIMM (RDIMM), and a Load Reduced DIMM (LRDIMM).

Figure 2:
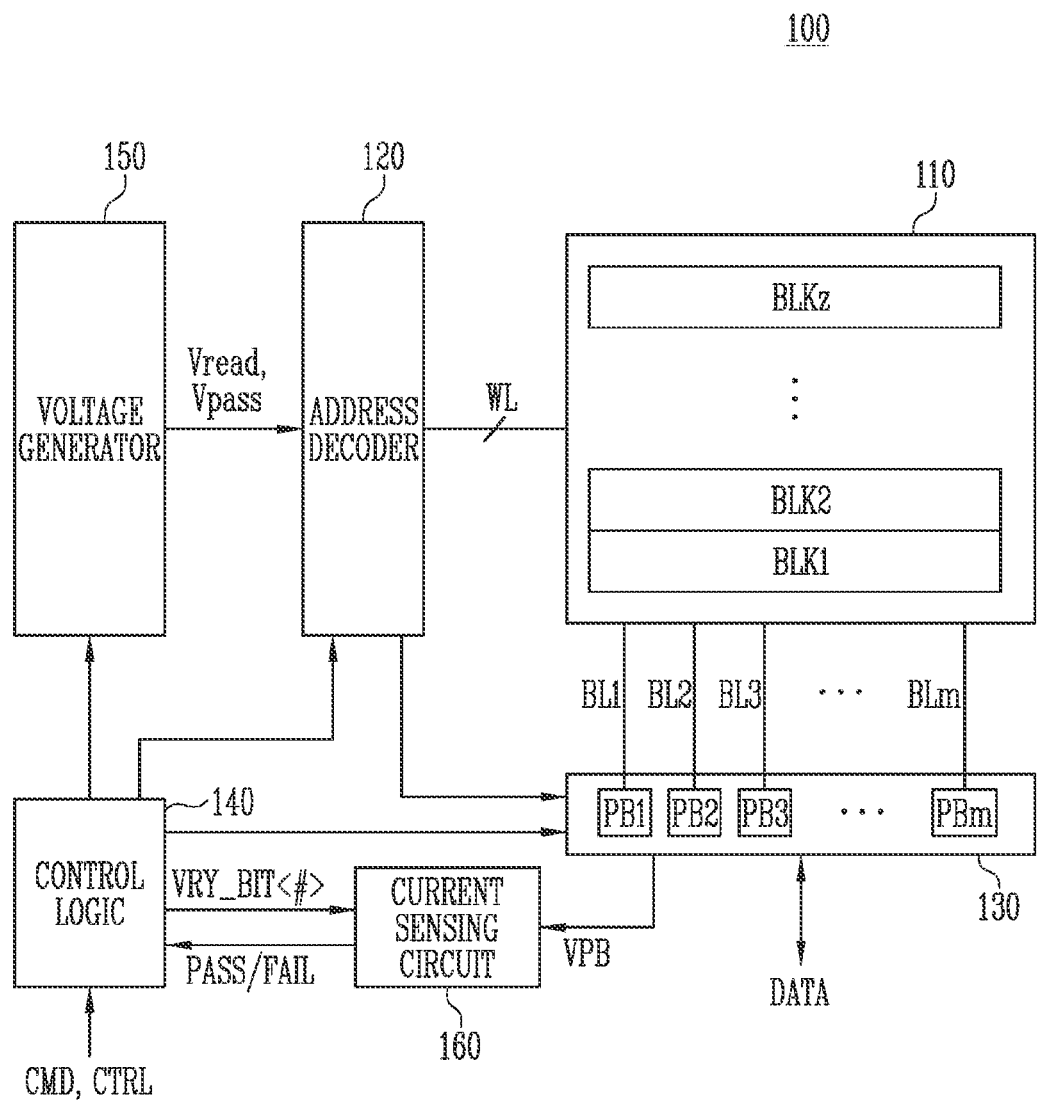
FIG. 2 is a diagram illustrating the memory device shown in FIG. 1.

FIG. 2 is a diagram illustrating the memory device 100 shown in FIG. 1.

Referring to FIG. 2, the memory device 100 may include a memory cell array 110, an address decoder 120, a read/write circuit 130, control logic 140, a voltage generator 150, and a current sensing circuit 160. The address decoder 120, the read/write circuit 130, the voltage generator 150, and the current sensing circuit 160 may be referred to as a peripheral circuit controlled by the control logic 140.

The memory cell array 110 may include a plurality of memory blocks BLK1 to BLKz. The plurality of memory blocks BLK1 to BLKz may be connected to the address decoder 120 through word lines WL. The plurality of memory blocks BLK1 to BLKz may be connected to the read/write circuit 130 through bit lines BL1 to BLm. Each of the plurality of memory blocks BLK1 to BLKz may include a plurality of memory cells. In an embodiment, the plurality of memory cells may be nonvolatile memory cells, and be configured with nonvolatile memory cells having a vertical channel structure. The memory cell array 110 may be configured as a memory cell array having a two-dimensional structure. In some embodiments, the memory cell array 110 may be configured as a memory cell array having a three-dimensional structure. Meanwhile, each of the plurality of memory cells included in the memory cell array 110 may store at least 1-bit data. In an embodiment, each of plurality of the memory cells included in the memory cell array 110 may be a single-level cell (SLC) storing 1-bit data. In another embodiment, each of the plurality of memory cells included in the memory cell array 110 may be a multi-level cell (MLC) storing 2-bit data. In still another embodiment, each of the plurality of memory cells included in the memory cell array 110 may be a triple-level cell (TLC) storing 3-bit data. In still another embodiment, each of the plurality of memory cells included in the memory cell array 110 may be a quadruple-level cell (QLC) storing 4-bit data. In some embodiments, the memory cell array 110 may include a plurality of memory cells each storing 5-or-more bit data.

The address decoder 120 may be connected to the memory cell array 110 through the word lines WL. The address decoder 120 may operate under the control of the control logic 140. The address decoder 120 may receive an address through an input/output buffer (not shown) in the memory device 100.

The address decoder 120 may decode a block address in the received address. The address decoder 120 may select at least one memory block according to the decoded block address. Also, in a read voltage application operation during a read operation, the address decoder 120 may apply a read voltage Vread generated by the voltage generator 150 to a selected word line of the selected memory block, and apply a pass voltage Vpass to the other unselected word lines. Also, in a program verify operation, the address decoder 120 may apply a verify voltage generated by the voltage generator 150 to the selected word line of the selected memory block, and apply the pass voltage Vpass to the other unselected word lines.

The address decoder 120 may decode a column address in the received address. The address decoder 120 may transmit the decoded column address to the read/write circuit 130.

A read operation and a program operation of the memory device 100 may be performed in units of pages. An address received in a request for the read operation and the program operation may include a block address, a row address, and a column address. The address decoder 120 may select one memory block and one word line according to the block address and the row address. The column address may be decoded by the address decoder 120 to be provided to the read/write circuit 130. In this specification, memory cells connected to one word line may be designated as a "physical page."

The read/write circuit 130 may include a plurality of page buffers PB1 to PBm. The read/write circuit 130 may operate as a "read circuit" in a read operation, and operate as a "write circuit" in a write operation. The plurality of page buffers PB1 to PBm may be connected to the memory cell array 110 through the bit lines BL1 to BLm. In order to sense a threshold voltage of memory cells in a read operation and a program verify operation, the plurality of page buffers PB1 to PBm may sense, through a sensing node, a change in amount of current flowing according to a program state of a corresponding memory cell while continuously supplying a sensing current to bit lines connected to the memory cells, and latch the change in amount of current as sensing data. The read/write circuit 130 operates in response to page buffer control signals output from the control logic 140. In this specification, the write operation of the write circuit may be used as the same meaning as a program operation on selected memory cells.

In a read operation, the read/write circuit 130 may temporarily store read data by sensing data of a memory cell and then output data DATA to the input/output buffer (not shown) of the semiconductor memory device 100. In an embodiment, the read/write circuit 130 may include a column select circuit and the like in addition to the page buffers (or page registers). In accordance with an embodiment of the present disclosure, the read/write circuit 130 may be a page buffer.

The control logic 140 may be connected to the address decoder 120, the read/write circuit 130, the voltage generator 150, and the current sensing circuit 160. The control logic 140 may receive a command CMD and a control signal CTRL though the input/output buffer (not shown) of the memory device 100. The control logic 140 may control a general operation of the semiconductor memory device 100 in response to the control signal CTRL. Also, the control logic 140 may output a control signal for adjusting a sensing node precharge potential level of the plurality of page buffers PB1 to PBm. The control logic 140 may control the read/write circuit 130 to perform a read operation of the memory cell array 110.

Meanwhile, the control logic 140 may determine whether a verify operation on a specific target program state has passed or failed in response to a pass signal PASS or a fail signal FAIL, which is received from the current sensing circuit 160. The control logic 140 may be implemented as hardware, software, or a combination of hardware and software. For example, the control logic 140 may be a control logic circuit operating in accordance with an algorithm and/or a processor executing control logic code.

The voltage generator 150 generates a read voltage Vread and a pass voltage Vpass in a read operation in response to a control signal output from the control logic 140. In order to generate a plurality of voltages having various voltage levels, the voltage generator 150 may include a plurality of pumping capacitors for receiving an internal power voltage. The voltage generator 150 may generate the plurality of voltages by selectively activating the plurality of pumping capacitors under the control of the control logic 140.

The sensing circuit 160 may generate a reference current and a reference voltage in response to an allow bit VRY_BIT<#> received from the control logic 140 in a verify operation. The sensing circuit 160 may output the pass signal PASS or the fail signal FAIL by comparing the generated reference voltage with a sensing voltage VPB received from the page buffers PB1 to PBm included in the read/write circuit 130 or by comparing the generated reference current with a sensing current received from the page buffers PB1 to PBm included in the read/write circuit 130.

The address decoder 120, the read/write circuit 130, the voltage generator 150, and the current sensing circuit 160 may serve as a "peripheral circuit" for performing a read operation, a write operation, and an erase operation on the memory cell array 110. The peripheral circuit may perform the read operation, the write operation, and the erase operation on the memory cell array 110 under the control of the control logic 140.

Figure 3:
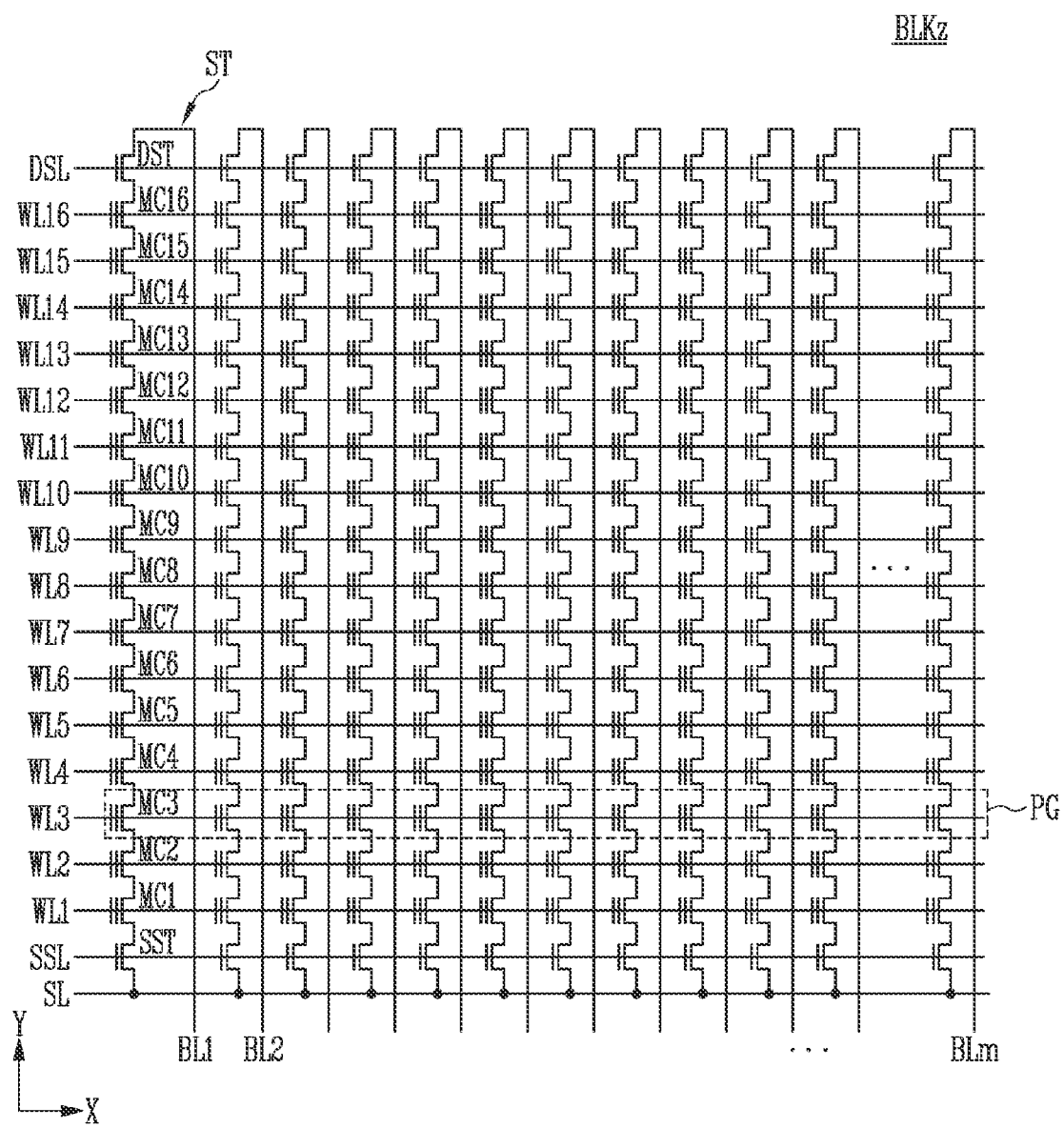
FIG. 3 is a diagram illustrating a structure of any one memory block among memory blocks shown in FIG. 2.

FIG. 3 is a diagram illustrating a structure of any one memory block among the memory blocks shown in FIG. 2.

The memory block BLKz represents any one memory block BLKi among the memory blocks BLK1 to BLKz shown in FIG. 2.

Referring to FIG. 3, in the memory block BLKi, a plurality of word lines arranged in parallel to each other may be connected between a first select line and a second select line. The first select line may be a source select line SSL, and the second select line may be a drain select line DSL. More specifically, the memory block BLKz may include a plurality of strings ST connected between bit lines BL1 to BLm and a source line SL. The bit lines BL1 to BLm may be respectively connected to the strings ST, and the source line SL may be commonly connected to the strings ST. The strings ST may be configured identically to one another, and therefore, a string ST connected to a first bit line BL1 will be described in detail as an example.

The string ST may include a source select transistor SST, a plurality of memory cells MC1 to MC16, and a drain select transistor DST, which are connected in series to each other between the source line SL and the first bit line BL1. At least one source select transistor SST and at least one drain select transistor DST may be included in one string ST, and memory cells of which number is greater than that of the memory cells MC1 to MC16 shown in the drawing may be included in the one string ST.

A source of the source select transistor SST may be connected to the source line SL, and a drain of the drain select transistor DST may be connected to the first bit line BL1. The memory cells MC1 to MC16 may be connected in series between the source select transistor SST and the drain select transistor DST. Gates of source select transistors SST included in different strings ST may be connected to the source select line SSL, and gates of drain select transistors DST included in different strings ST may be connected to the drain select line DSL. Gates of the memory cells MC1 to MC16 may be connected to a plurality of word lines WL1 to WL16. A group of memory cells connected to the same word line among memory cells included in different strings ST may be referred to as a physical page PG. Therefore, physical pages PG corresponding to the number of the word lines WL1 to WL16 may be included in the memory block BLKi.

One memory cell may store one bit of data. The one memory cell is generally referred to as a single-level cell (SLC). One physical page PG may store one logical page (LPG) data. One LPG data may include data bits corresponding to the number of cells included in the one physical page PG.

One memory cell may store two or more bits of data. One physical page PG may store two or more LPG data.

Figure 4:
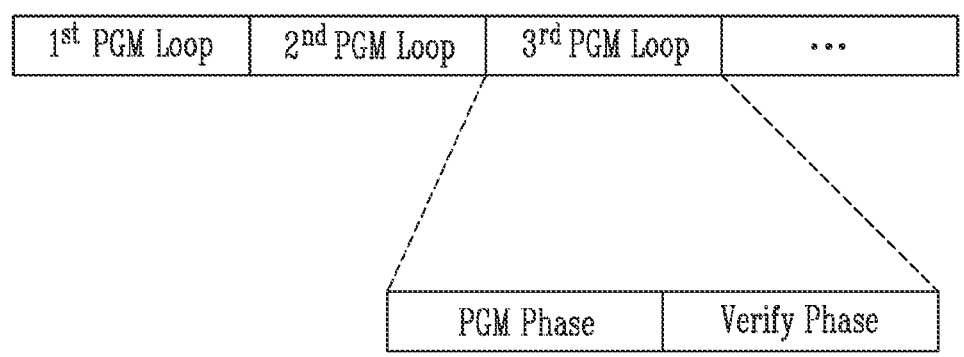
FIG. 4 is a diagram illustrating a plurality of program loops included in a program operation, and a program voltage application operation and a verify operation, which are included in each program loop.

FIG. 4 is a diagram illustrating a plurality of program loops included in a program operation, and a program voltage application operation and a verify operation, which are included in each program loop.

Referring to FIG. 4, a program operation may include a plurality of program loops. As shown in FIG. 4, the program operation may be started by performing a first program loop $1^{st}$ PGM Loop. In the present disclosure, a program voltage application operation may mean an operation of changing a threshold voltage of memory cells to a target threshold voltage by applying a program pulse to the memory cells. In the present disclosure, the program voltage application operation may be expressed as a pulse application operation.

When selected memory cells are not completely programmed even though the first program loop $1^{st}$ PGM Loop has been performed, a second program loop $2^{nd}$ PGM Loop may be performed. When the selected memory cells are not completely programmed even though the second program loop $2^{nd}$ PGM Loop has been performed, a third program loop $3^{rd}$ PGM Loop may be performed. In this manner, program loops may be repeatedly performed until the program operation is completed.

Meanwhile, when the program operation is not completed even though the program loops have been repeated until a predetermined maximum program loop number, it may be determined that the program operation has failed.

Figure 5A:
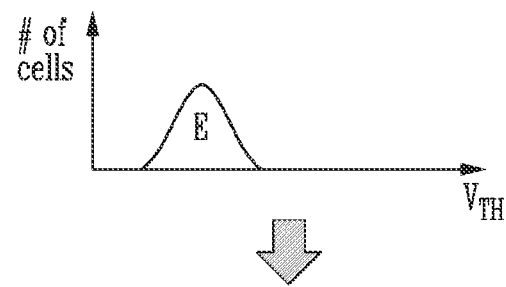
FIGS. 5A and 5B are diagrams illustrating a threshold voltage distribution of a single level cell.
Figure 5B:
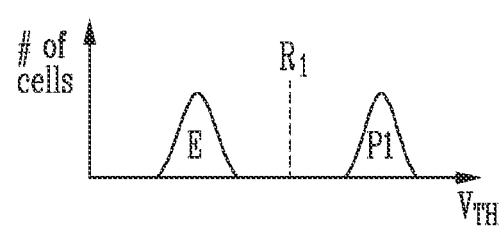

FIGS. 5A and 5B are diagrams illustrating a threshold voltage distribution of an SLC.

Referring to FIGS. 5A and 5B, a horizontal axis indicates a threshold voltage of a memory cell, and a vertical axis indicates the number of memory cells.

The memory device may perform a program operation in units of word lines. A plurality of memory cells connected to one word line may constitute one physical page. The physical page may be a unit of a program or read operation.

The memory device may perform a program operation to store data in memory cells connected to a selected word line among a plurality of word lines.

Selected memory cells as the memory cells connected to the selected word line may have a threshold voltage distribution corresponding to an erase state E as shown in FIG. 5A before the program operation is performed.

When a memory cell stores data corresponding to one bit, the memory cell may be programmed to have a threshold voltage corresponding to any one of the erase state E and a first program state P1.

The erase state E may correspond to data '1,' and the first program state P1 may correspond to data '0.' However, the data corresponding to the first program state P1 is merely illustrative. The erase state E may correspond to the data '0,' and the first program state P1 may correspond to the data '1.'

When the program operation is ended, the selected memory cells may have a threshold voltage corresponding to any one of the erase state E and the first program state P1 as shown in FIG. 5B. The memory device performs a read operation using a first read voltage R1 between the erase state E and the first program state P1, so that data stored in the selected memory cells can be read.

Figure 6A:
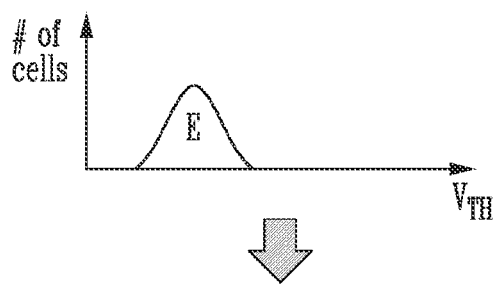
FIGS. 6A and 6B are diagrams illustrating a threshold voltage distribution of a multi-level cell.
Figure 6B:
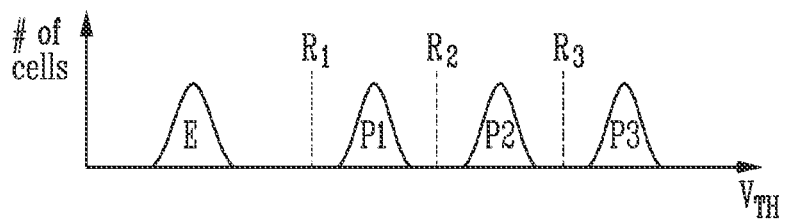

FIGS. 6A and 6B are diagrams illustrating a threshold voltage distribution of an MLC.

Referring to FIGS. 6A and 6B, a horizontal axis indicates a threshold voltage of a memory cell, and a vertical axis indicates the number of memory cells.

Selected memory cells as the memory cells connected to the selected word line may have a threshold voltage distribution corresponding to an erase state E as shown in FIG. 6A before the program operation is performed.

When a memory cell stores data corresponding to two bits, the memory cell may be programmed to have a threshold voltage corresponding to any one of the erase state E, a first program state P1, a second program state P2, and a third program state P3.

The erase state E may correspond to data '11,' the first program state P1 may correspond to data '10,' the second program state P2 may correspond to data '00,' and the third program state P3 may correspond to data '01.' However, data corresponding to each program state is merely illustrative, and may be variously changed.

When the program operation is ended, the selected memory cells may have a threshold voltage corresponding to any one of the erase state E, the first program state P1, the second program state P2, and the third program state P3 as shown in FIG. 6B. The memory device performs a read operation using first to third read voltages R1 to R3, so that data stored in the selected memory cells can be read.

The first read voltage R1 may be a read voltage for distinguishing the erase state E and the first program state P1 from each other, the second read voltage R2 may be a read voltage for distinguishing the first program state P1 and the second program state P2 from each other, and the third read voltage R3 may be a read voltage for distinguishing the second program state P2 and the third program state P3 from each other.

FIGS. 7A and 7B are diagrams illustrating a threshold voltage distribution of a TLC.

Referring to FIGS. 7A and 7B, a horizontal axis indicates a threshold voltage of a memory cell, and a vertical axis indicates the number of memory cells.

Selected memory cells as the memory cells connected to the selected word line may have a threshold voltage distribution corresponding to an erase state E as shown in FIG. 7A before the program operation is performed.

When a memory cell stores data corresponding to three bits, the memory cell may be programmed to have a threshold voltage corresponding to any one of the erase state E, a first program state P1, a second program state P2, a third program state P3, a fourth program state P4, a fifth program state P5, a sixth program state P6, and a seventh program state P7.

The erase state E may correspond to data '111,' the first program state P1 may correspond to data '110,' the second program state P2 may correspond to data '101,' the third program state P3 may correspond to data '100,' the fourth program state P4 may correspond to data '011,' the fifth program state P5 may correspond to data '101,' the sixth program state P6 may correspond to data '001,' and the seventh program state P7 may correspond to data '000.' However, data corresponding to each program state is merely illustrative, and may be variously changed.

When the program operation is ended, the selected memory cells may have a threshold voltage corresponding to any one of the erase state E, the first program state P1, the second program state P2, the third program state P3, the fourth program state P4, the fifth program state P5, the sixth program state P6, and the seventh program state P7 as shown in FIG. 7B. The memory device performs a read operation using first to seventh read voltages R1 to R7, so that data stored in the selected memory cells can be read.

The first read voltage R1 may be a read voltage for distinguishing the erase state E and the first program state P1 from each other, the second read voltage R2 may be a read voltage for distinguishing the first program state P1 and the second program state P2 from each other, the third read voltage R3 may be a read voltage for distinguishing the second program state P2 and the third program state P3 from each other, the fourth read voltage R4 may be a read voltage for distinguishing the third program state P3 and the fourth program state P4 from each other, the fifth read voltage R5 may be a read voltage for distinguishing the fourth program state P4 and the fifth program state P5 from each other, the sixth read voltage R6 may be a read voltage for distinguishing the fifth program state P5 and the sixth program state P6 from each other, and the seventh read voltage R7 may be a read voltage for distinguishing the sixth program state P6 and the seventh program state P7 from each other.

FIGS. 8A and 8B are diagrams illustrating a threshold voltage distribution of a QLC.

Referring to FIGS. 8A and 8B, a horizontal axis indicates a threshold voltage of a memory cell, and a vertical axis indicates the number of memory cells.

Selected memory cells as the memory cells connected to the selected word line may have a threshold voltage distribution corresponding to an erase state E as shown in FIG. 8A before the program operation is performed.

When a memory cell stores data corresponding to four bits, the memory cell may be programmed to have a threshold voltage corresponding to any one of the erase state E and first to fifteenth program states P1 to P15.

The erase state E may correspond to data '1111,' the first program state P1 may correspond to data '1110,' the second program state P2 may correspond to data '1101,' the third program state P3 may correspond to data '1100,' the fourth program state P4 may correspond to data '1011,' the fifth program state P5 may correspond to data '1010,' the sixth program state P6 may correspond to data '1001,' and the seventh program state P7 may correspond to data '1000.' In addition, the eighth program state P8 may correspond to data '0111,' the ninth program state P9 may correspond to data '0110,' the tenth program state P10 may correspond to data '0101,' the eleventh program state P11 may correspond to data '0100,' the twelfth program state P12 may correspond to data '0011,' the thirteenth program state P13 may correspond to data '0010,' the fourteenth program state P14 may correspond to data '0001,' and the fifteenth program state P15 may correspond to data '0000.' However, data corresponding to each program state is merely illustrative, and may be variously changed.

When the program operation is ended, the selected memory cells may have a threshold voltage corresponding to any one of the erase state E and the first to fifteenth program states P1 to P15 as shown in FIG. 8B. The memory device performs a read operation using first to fifteenth read voltages R1 to R15, so that data stored in the selected memory cells can be read.

The first read voltage R1 may be a read voltage for distinguishing the erase state E and the first program state P1 from each other, the second read voltage R2 may be a read voltage for distinguishing the first program state P1 and the second program state P2 from each other, the third read voltage R3 may be a read voltage for distinguishing the second program state P2 and the third program state P3 from each other, the fourth read voltage R4 may be a read voltage for distinguishing the third program state P3 and the fourth program state P4 from each other, the fifth read voltage R5 may be a read voltage for distinguishing the fourth program state P4 and the fifth program state P5 from each other, the sixth read voltage R6 may be a read voltage for distinguishing the fifth program state P5 and the sixth program state P6 from each other, the seventh read voltage R7 may be a read voltage for distinguishing the sixth program state P6 and the seventh program state P7 from each other, the eighth read voltage R8 may be a read voltage for distinguishing the seventh program state P7 and the eighth program state P8 from each other, the ninth read voltage R9 may be a read voltage for distinguishing the eighth program state P8 and the ninth program state P9 from each other, the tenth read voltage R10 may be a read voltage for distinguishing the ninth program state P9 and the tenth program state P10 from each other, the eleventh read voltage R11 may be a read voltage for distinguishing the tenth program state P10 and the eleventh program state P11 from each other, the twelfth read voltage R12 may be a read voltage for distinguishing the eleventh program state P11 and the twelfth program state P12 from each other, the thirteenth read voltage R13 may be a read voltage for distinguishing the twelfth program state P12 and the thirteenth program state P13 from each other, the fourteenth read voltage R14 may be a read voltage for distinguishing the thirteenth program state P13 and the fourteenth program state P14 from each other, and the fifteenth read voltage R15 may be a read voltage for distinguishing the fourteenth program state P14 and the fifteenth program state P15 from each other.

In the following figures from FIG. 9, for convenience of description, it is assumed that each of a plurality of memory cells is a Multi-Level Cell (MLC) storing 2-bit data. However, the scope of the present disclosure is not limited thereto, and each of the plurality of memory cells may be a Triple Level Cell (TLC) storing 3-bit data or a Quad Level Cell (QLC) storing 4-bit data.

Figure 9:
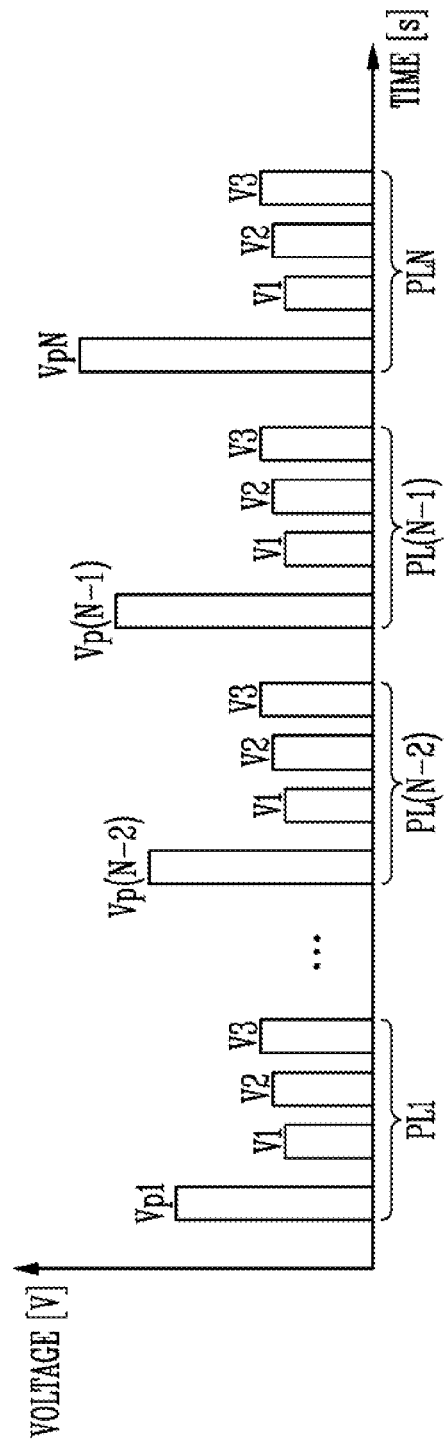
FIG. 9 is a diagram illustrating a normal program operation.

FIG. 9 is a diagram illustrating a normal program operation.

Referring to FIG. 9, N program loops are illustrated. Each of a plurality of program loops may include a program pulse application operation and a verify operation. In FIG. 9, the horizontal axis may represent time, and the vertical axis may represent magnitude of voltage.

A program operation of the memory device 100 may include a plurality of program loops PL1 to PLN. That is, the memory device 100 may program selected memory cells to have a threshold voltage distribution corresponding to any one state among a plurality of program states by performing the plurality of program loops PL1 to PLN.

Each of the plurality of program loops PL1 to PLN may include a program voltage application operation of applying a program voltage and a verify operation of determining whether memory cells have been programmed by applying verify voltages.

For example, when a first program loop PL1 is performed, first to third verify voltages V1 to V3 may be sequentially applied so as to verify a program state of a plurality of memory cells after a first program pulse Vp1 is applied. Memory cells of which target program state is a first program state may be verified by a first verify voltage V1, memory cells of which target program state is a second program state may be verified by a second verify voltage V2, and memory cells of which target program state is a third program state may be verified by a third verify voltage V3.

Memory cells which have verify-passed by each of the verify voltages V1 to V3 may be determined to have a target program state, and be program-inhibited in a next program loop.

A program pulse applied to memory cells may be increased by a unit voltage. For example, a program pulse Vp(N−2) included in an (N−2)th program loop PL(N−2) may be smaller by the unit voltage than a program pulse Vp(N−1) included in an (N−1)th program loop PL(N−1).

In a verify operation, a verify voltage may be applied to a selected word line as a word line to which the selected memory cell are connected. A page buffer may determine whether memory cells has verify-passed, based on a current or voltage flowing through bit lines respectively connected to the selected memory cells.

Figure 10:
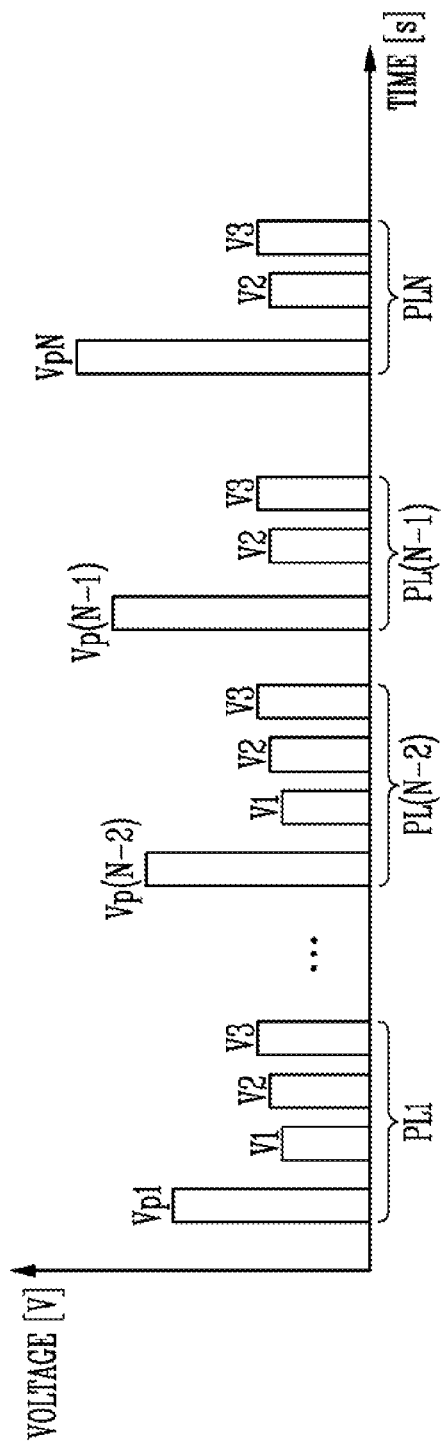
FIG. 10 is a diagram illustrating a program operation in accordance with an embodiment of the present disclosure.

FIG. 10 is a diagram illustrating a program operation in accordance with an embodiment of the present disclosure.

Referring to FIG. 10, N program loops are illustrated. Each of a plurality of program loops may include a program pulse application operation and a verify operation. In FIG. 10, the horizontal axis may represent time, and the vertical axis may represent magnitude of voltage.

It may be assumed that a verify operation on a first verify voltage V1 is completed in an Nth program loop PLN. When an Nth program pulse VpN is applied to memory cells, a threshold voltage of memory cells of which target program state is a first program state among the memory cells may be included in a threshold voltage distribution corresponding to the first program state.

In accordance with an embodiment of the present disclosure, when that the verify operation has passed in the Nth program loop PLN is recognizable in an (N−2)th program loop PL(N−2), a verify operation on the first verify voltage V1 in an (N−1)th program loop PL(N−1) may be omitted. In a program pulse application operation included in the Nth program loop PLN, a program limit voltage applied to a bit line of memory cells may be determined based on the result of a verify operation included in the (N−2)th program loop PL(N−2).

Specifically, a verify pass reference may be set such that the threshold voltage of the memory cells reaches a first target threshold voltage in the Nth program loop PLN among the plurality of program loops, and a verify pass signal is received in the (N−2)th program loop PL(N−2). Cell status information representing a program state of the memory cells may be stored based on the result of the verify operation included in the (N−2)th program loop PL(N−2).

An (N−1)th program pulse Vp(N−1) may be applied in the (N−1)th program loop PL(N−1), and the verify operation on the first verify voltage V1 may be omitted. When the (N−1)th program pulse Vp(N−1) is applied, the program limit voltage applied to the bit line of the memory cells may be determined by the cell status information.

For example, a ground voltage may be applied to a bit line of memory cells corresponding to a program cell state representing that the threshold voltage is lower than a predetermined auxiliary verify voltage among the memory cells. A program allow voltage may be applied to a bit line of memory cells corresponding to a double program cell state representing that the threshold voltage is equal to or higher than the auxiliary verify voltage and is lower than a predetermined main verify voltage among the memory cells. A program inhibit voltage may be applied to a bit line of memory cells corresponding to a program inhibit cell state representing that the threshold voltage is equal to or higher than the main verify voltage among the memory cells. The cell status information may represent whether the program state of memory cells is the program cell state, the double program cell state, or the program inhibit cell state.

In accordance with an embodiment of the present disclosure, when a program operation is performed in the (N−1)th program loop PL(N−1) and the Nth program loop PLN, the verify operation on the first verify voltage V1 may be omitted. When the verify operation on the first verify voltage V1 is omitted, a total program time can be reduced. In accordance with the embodiment of the present disclosure, the memory device having an improved program speed can be provided.

Figures 11, 12:
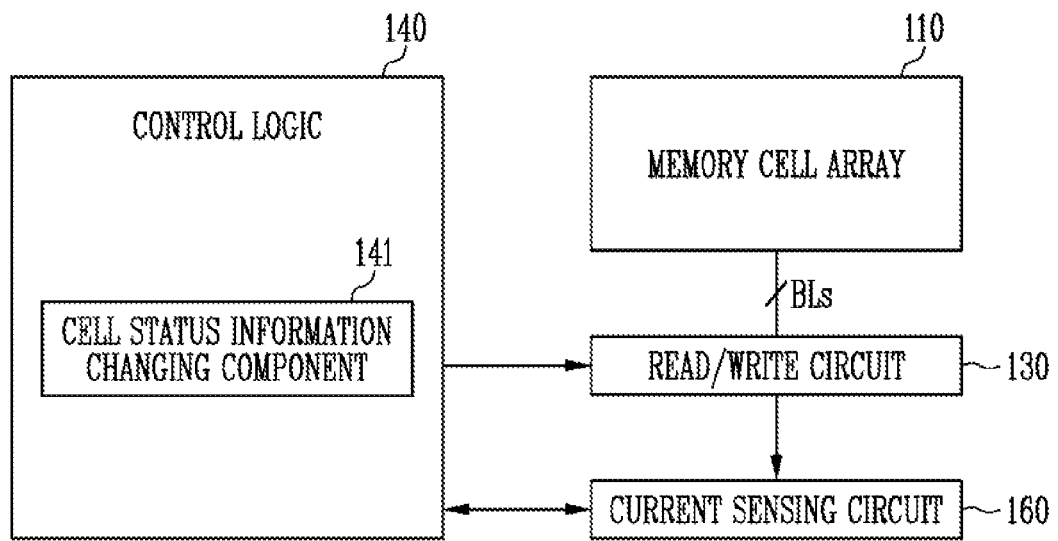
FIG. 11 is a block diagram illustrating a program operation in accordance with an embodiment of the present disclosure.
FIG. 12 is a diagram illustrating cell status information in accordance with an embodiment of the present disclosure.

FIG. 11 is a block diagram illustrating a program operation in accordance with an embodiment of the present disclosure.

Referring to FIG. 11, the control logic 140 may control a peripheral circuit including a page buffer and a current sensing circuit. The peripheral circuit may perform a write operation, a read operation, and an erase operation on a memory block included in the memory cell array. The peripheral circuit may apply a voltage to bit and word lines of memory cells included in the memory block. For example, the peripheral circuit may perform a program operation including a plurality of program loops. Each of the plurality of program loops may include a program pulse application operation of increasing a threshold voltage of the memory cells by applying a program pulse and a verify operation of verifying whether the threshold voltage of the memory cells has reached a target threshold voltage.

In accordance with an embodiment of the present disclosure, the control logic 140 may transmit a control signal to the read/write circuit 130 and the current sensing circuit 160. The control logic 140 may control the peripheral circuit to store cell status information representing a program state of each of memory cells, corresponding to the verify operation, and apply a program limit voltage to each bit line of the memory cells according to the cell status information in the program pulse application operation.

The memory cell array 110 may include a plurality of memory blocks. The plurality of memory blocks may be connected to the read/write circuit 130 through bit lines BLs. Each of the plurality of memory blocks may include a plurality of memory cells.

The read/write circuit 130 may include a plurality of page buffers. The plurality of page buffers may be connected to the memory cell array 110 through the bit lines. The plurality of page buffers may transmit, to the current sensing circuit 160, sensing data obtained by sensing a change in amount of current flowing according to a program state of a corresponding memory cell.

The current sensing circuit 160 may perform a current sensing operation by receiving the sensing data from the read/write circuit 130. The current sensing operation is an operation of determining whether memory cells have been programmed to a target state, and may include an individual current sensing operation and a total current sensing operation.

The current sensing circuit 160 may generate a reference current and a reference voltage in response to a predetermined allow bit, and generate a verify current and a verify voltage according to the sensing data. The current sensing circuit 160 may transmit a verify pass signal or a verify fail signal to the control logic 140 by comparing the reference voltage and the verify voltage with each other.

The control logic 140 may set a verify pass reference such that the threshold voltage of the memory cells reaches the target threshold voltage in a program loop performed secondly from a program loop in which the verify pass signal of the verify operation is received. The verify pass reference may be set such that a number of memory cells corresponding to a program cell state among the memory cells is smaller than a predetermined number. The control logic 140 may control the peripheral circuit to apply the program limit voltage to each bit line of the memory cells according to the cell status information in the program pulse application operation.

The cell status information of the present disclosure may be information representing that each memory cell corresponds to any one cell state among a program cell state representing that a threshold voltage of the memory cell is lower than a predetermined auxiliary verify voltage, a double program cell state representing that the threshold voltage of the memory cells is equal to or higher than the auxiliary verify voltage and is lower than a predetermined main verify voltage, and a program inhibit cell state representing that the threshold voltage of the memory cell is higher than the main verify voltage.

The program limit voltage of the present disclosure may include a ground voltage corresponding to the program cell state, a program allow voltage corresponding to the double program cell state, and a program inhibit voltage corresponding to the program inhibit cell state. For example, the program inhibit voltage may be a power voltage. The program allow voltage may be half the power voltage. In an embodiment of the present disclosure, when the program limit voltage is applied to the bit line of the memory cells in the program operation, the program speed of the memory cells may be decreased. When the threshold voltage of the memory cells becomes close to the target threshold voltage, the program limit voltage may be applied to the bit line of the memory cells.

In an embodiment of the present disclosure, when a number of memory cells for which the verify operation fails among memory cells to be programmed to a selected program state is equal to or smaller than that determined by verify pass setting, the current sensing circuit 160 may determine that a verify operation on the selected program state has passed, and output the verify pass signal. When the number of memory cells for which the verify operation fails among the memory cell to be programmed to the selected program state exceeds that determined by the verify pass setting, the current sensing circuit 160 may determine that a verify operation on a specific program state has failed, and output the verify fail signal.

In another embodiment of the present disclosure, the peripheral circuit may output the verify pass signal, corresponding to that a number of memory cells for which threshold voltage reaches the target threshold voltage among the memory cells is equal to or greater than that determined by the verify pass reference.

The control logic 140 may further include a cell status information changing component 141. The cell status information changing component 141 may change the cell status information, corresponding to a first pulse application operation included in a next program loop of the program loop in which the verify pass signal is received. For example, the cell status information changing component 141 may control the peripheral circuit to change, to the program inhibit cell state, a program state of memory cells, which corresponds to the double program cell state included in the cell status information stored when the verify pass signal is received. The cell status information changing component 141 may control the peripheral circuit to change, to the double program cell state, a program state of memory cells, which corresponds to the program cell state.

In another embodiment of the present disclosure, the control logic 140 may set the verify pass reference such that the threshold voltage of the memory cells reaches the target threshold voltage in an Nth program loop among the plurality of program loops, and the verify pass signal is received in an (N−2)th program loop. The control logic 140 may store cell status information representing a program state of each of the memory cells, corresponding to a verify operation included in the (N−2)th program loop. The control logic 140 may apply the program limit voltage to each bit line of the memory cells in program pulse application operations of the Nth program loop and the (N−1)th program loop, based on the stored cell status information.

In another embodiment of the present disclosure, the cell status information changing component 141 may change the cell status information, corresponding to a pulse application operation included in an (N−1)th program loop as a next program loop of the (N−2)th program loop in which the verify pass signal is received. The cell status information changing component 141 may control the peripheral circuit to change, to the program inhibit cell state, a program state of the memory cell, which corresponds to the double program cell state included in the stored cell status information. The cell status information changing component 141 may control the peripheral circuit to change, to the double program cell state, a program state of the memory cells, which corresponds to the program cell state.

In an embodiment of the present disclosure, the control logic 140 may control the peripheral circuit to apply the program limit voltage to the bit line of the memory cells according to the cell status information changed by the cell status information changing component 141, when a second pulse application operation included in a next program loop of the program loop including the first pulse application operation is performed. The control logic 140 may control the peripheral circuit to omit the verify operation in the program loop including the first pulse application operation and the program loop including the second pulse application operation.

In another embodiment of the present disclosure, the control logic 140 may control the peripheral circuit to apply the program limit voltage to the bit line of the memory cells according to the cell status information changed by the cell status information changing component 141, when the program pulse application operation included in the Nth program loop is performed.

In another embodiment of the present disclosure, the control logic 140 may control the peripheral circuit to omit the verify operation in the (N−1)th program loop and the Nth program loop. The control logic 140 may control the peripheral circuit to apply the program inhibit voltage to a bit line of memory cells of which program state is indicated as the double program cell state by the cell status information among the memory cells. The control logic 140 may control the peripheral circuit to apply the program allow voltage to a bit line of memory cells of which program state is indicated as the program cell state by the cell status information.

In another embodiment of the present disclosure, the control logic 140 may control the peripheral circuit to apply the program inhibit voltage to a bit line of memory cells of which program state is indicated as the double program cell state by the cell status information stored when the verify pass signal is received among the memory cells, in a program pulse application operation of the program loop performed secondly from the program loop in which the verify pass signal of the verify operation is received. The control logic 140 may control the peripheral circuit to apply the program allow voltage to a bit line of the memory cells of which program state is indicated as the program cell state.

FIG. 12 is a diagram illustrating cell status information in accordance with an embodiment of the present disclosure.

Referring to FIG. 12, a table is illustrated, in which a program limit voltage is determined based on cell status information stored in an (N−2)th program loop to an Nth program loop.

In an embodiment of the present disclosure, each of an (N−3)th program loop and the (N−2)th program loop may include a program pulse application operation and a verify operation (1210). In the program pulse application operation, a program limit voltage applied to a bit line of a memory cell may be determined according to cell status information as a result of a verify operation of a previous program loop. For example, in the (N−2)th program loop, a ground voltage may be applied to a bit line of zeroth to $50^{th}$ cells (#0 to #50) in the program pulse application operation. A program allow voltage may be applied to a bit line of $51^{st}$ to $150^{th}$ cells (#51 to #150). A program inhibit voltage may be applied to a bit line of $151^{st}$ to $300^{th}$ cells (#151 to #300).

The control logic has received a verify pass signal in the (N−2)th program loop, and therefore, a verify operation in the (N−1)th program loop may be omitted. In a program pulse application operation of the (N−1)th program loop, a program limit voltage applied to a bit line of memory cells may be determined according to cell status information as a result of the verify operation included in the (N−2)th program loop.

The verify operation in the (N−1)th program loop has been omitted, and therefore, any cell status information to determine a program limit voltage applied to a bit line of memory cells may not exist in a program pulse application operation of the Nth program loop. The cell status information changing component may change cell status information of a memory cell without any verify operation, corresponding to that a verify operation on a first verify voltage is omitted in the (N−1)th program loop.

For example, the cell status information changing component may change cell status information of zeroth cell to 30th cells (#0 to #30), of which program state is the double program cell state in the (N−1)th program loop, from the program cell state to the double program cell state. Similarly, the cell status information changing component may change cell status information of 31st to 70th cells (#31 to #70), of which program state is the program cell state in the (N−1)th program loop, from the double program cell state to the program inhibit cell state.

Although the verify operation has been omitted in the (N−1)th program loop, the cell status information changing component may update cell status information for the Nth program loop. In the program pulse application operation in the Nth program loop, the control logic may control the peripheral circuit to apply a program limit voltage to the bit line of the memory cells according to the changed cell status information.

In accordance with the embodiment of the present disclosure, although the verify operation is omitted, the performance of a next program operation is not influenced, and thus a total program time can be reduced.

Figure 13:
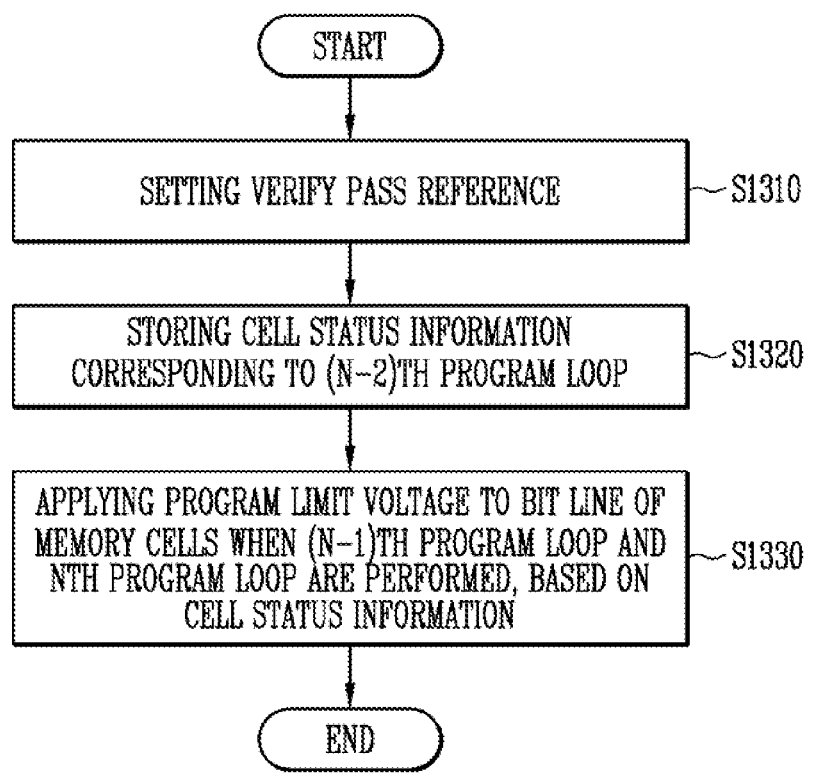
FIG. 13 is a flowchart illustrating a program operation in accordance with an embodiment of the present disclosure.

FIG. 13 is a flowchart illustrating a program operation in accordance with an embodiment of the present disclosure.

Referring to FIG. 13, a verify operation in an (N−1)th program loop may be omitted. The memory device may include a memory block including memory cells, a peripheral circuit for performing a program operation including a plurality of program loops, and control logic for controlling the peripheral circuit to apply a program limit voltage to each bit line of the memory cells, corresponding to the program operation.

In step S1310, the control logic may set a verify pass reference such that a threshold voltage of memory cells reaches a target threshold voltage in an Nth program loop among the plurality of program loops, and a verify pass signal is received in an (N−2)th program loop.

In step S1320, the peripheral circuit may store cell status information representing a program state of each of the memory cells, corresponding to a verify operation included in the (N−2)th program loop.

In step S1330, the control logic may apply the program limit voltage to each bit line of the memory cells in a program pulse application operation of each of the (N−1)th program loop and the Nth program loop, based on the stored cell status information.

The program operation shown in FIG. 13 may correspond to the program operation of the present disclosure, which is described with reference to FIGS. 10 to 12.

Figure 14:
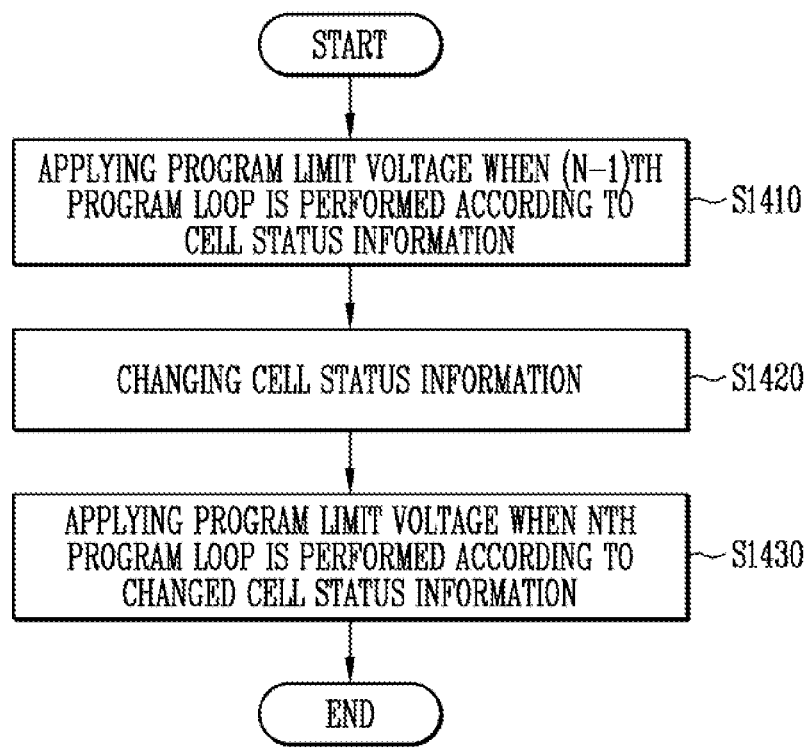
FIG. 14 is a block diagram illustrating a method for applying a program limit voltage to a bit line of memory cells in accordance with an embodiment of the present disclosure.

FIG. 14 is a block diagram illustrating a method for applying a program limit voltage to a bit line of memory cells in accordance with an embodiment of the present disclosure.

Referring to FIG. 14, the control logic may apply a program limit voltage to a bit line of memory cells in a program pulse application operation included in a program loop.

In step S1410, the control logic may apply the program limit voltage in a program pulse application operation included in an (N−1)th program loop according to cell status information. The control logic may apply a ground voltage to a bit line of memory cells corresponding to a program cell state representing that a threshold voltage is lower than a predetermined auxiliary verify voltage among the memory cells. The control logic may apply a program allow voltage to a bit line of memory cells corresponding to a double program cell state representing that the threshold voltage is equal to or higher than the auxiliary verify voltage and is lower than a predetermined main verify voltage among the memory cells. The control logic may apply a program inhibit voltage to a bit line of memory cells corresponding to a program inhibit cell state representing that the threshold voltage is higher than the main verify voltage among the memory cells.

In step S1420, the cell status information changing component may change cell status information stored in the peripheral circuit. The cell status information changing component may update cell status information for an Nth program loop by using a predetermined method, even though the verify operation in the (N−1)th program loop has been omitted. The cell status information changing component may change cell status information of memory cells of which program state is the double program cell state among the memory cells to the program inhibit cell state. The cell status information changing component may change cell status information of memory cells of which program state is the program cell state among the memory cells to the double program cell state.

In step S1430, the control logic may apply the program limit voltage in a program pulse application operation included in the Nth program loop according to the changed cell status information. Based on the change cell status information, the control logic may apply the program allow voltage, corresponding to the double program cell state, and apply the program inhibit voltage, corresponding to the program inhibit cell state.

Figure 15:
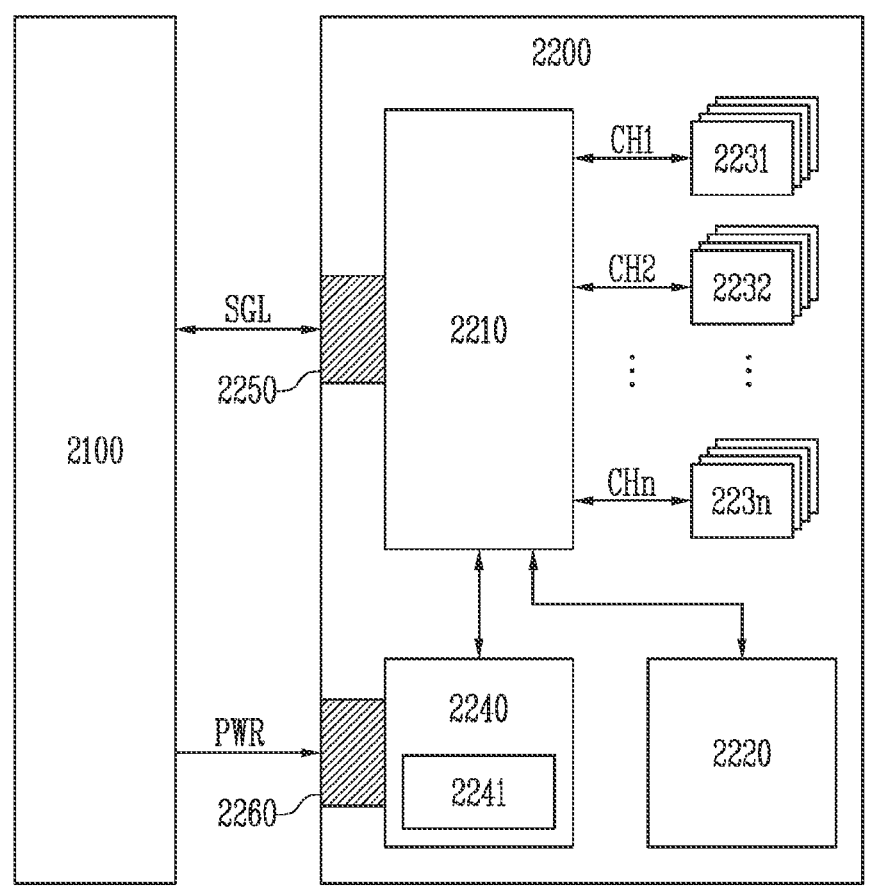
FIG. 15 is a diagram illustrating a data processing system including a solid state drive in accordance with an embodiment of the present disclosure.

FIG. 15 is a diagram illustrating a data processing system 2000 including a solid state drive (SDD) in accordance with an embodiment of the present disclosure.

Referring to FIG. 15, the data processing system 2000 includes a host device 2100 and an SSD 2200.

The SSD 2200 may include a controller 2210, a buffer memory device 2220, nonvolatile memories 2231 to 223$n$, a power supply 2240, a signal connector 2250, and a power connector 2260. The controller 2210 may control overall operations of the SSD 2200.

The buffer memory device 2220 may temporarily store data to be stored in the nonvolatile memories 2231 to 223$n$. Also, the buffer memory device 2220 may temporarily store data read from the nonvolatile memories 2231 to 223$n$. The data temporarily stored in the buffer memory device 2220 may be transmitted to the host device 2100 or the nonvolatile memories 2231 to 223$n$ under the control of the controller 2210.

The nonvolatile memories 2231 to 223$n$ may be used as a storage medium of the SSD 2200. Each of the nonvolatile memories 2231 to 223$n$ may be connected to the controller 2210 through a plurality of channels CH1 to CHn. One or more nonvolatile memories may be connected to one channel. Nonvolatile memories connected to one channel may be connected to the same signal bus and the same data bus.

The power supply 2240 may provide power PWR input through the power connector 2260 to the inside of the SSD 2200. The power supply 2240 may include an auxiliary power supply 2241. The auxiliary power supply 2241 may supply power such that the SSD 2200 can be normally ended, when sudden power loss occurs. The auxiliary power supply 2241 may include large-capacity capacitors capable of charging the power PWR.

The controller 2210 may exchange a signal SGL with the host device 2100 through the signal connector 2250. The signal SGL may include a command, an address, data, and the like. The signal connector 2250 may be configured as various types of connectors according to an interface method between the host device 2100 and the SSD 2200.

Figure 16:
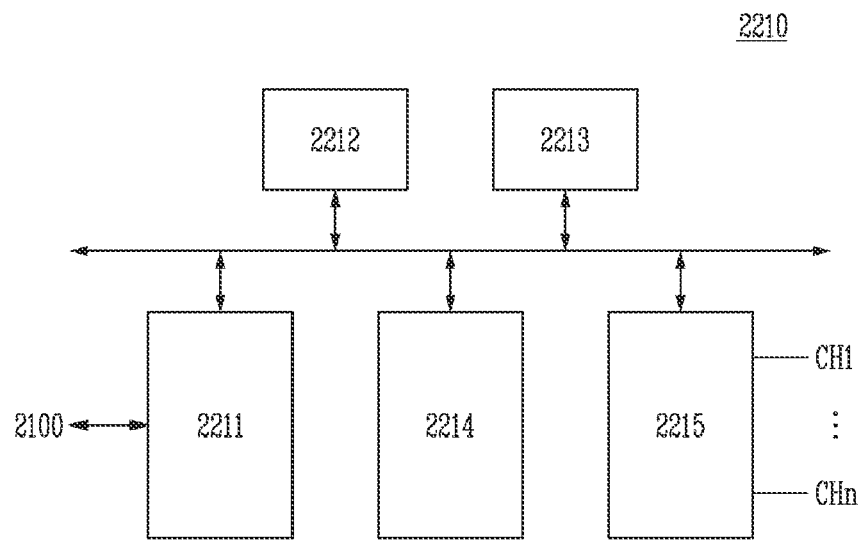
FIG. 16 is a diagram illustrating a configuration of a controller shown in FIG. 15.

FIG. 16 is a diagram illustrating a configuration of the controller shown 2210 in FIG. 15.

Referring to FIG. 16, the controller 2210 may include a host interface unit 2211, a control unit 2212, random access memory 2213, an error correction code (ECC) unit 2214, and a memory interface unit 2215.

The host interface unit 2211 may interface with the host device 2100 and the SSD 2200. For example, the host interface unit 2211 may communicate with the host device 2100 through any one of protocols such as secure digital, Universal Serial Bus (USB), Multi-Media Card (MMC), Embedded MMC (eMMC), Personal Computer Memory Card International Association (PCMCIA), Parallel Advanced Technology Attachment (PATA), Serial Advanced Technology Attachment (SATA), Small Computer System Interface (SCSI), Serial Attached SCSI (SAS), Peripheral Component Interconnection (PCI), PCI Express (PCI-E), and Universal Flash Storage (UFS). Also, the host interface unit 2211 may perform a disk emulation function for supporting the host device 2100 to recognize the SSD 2200 as a general-purpose data storage device, e.g., a Hard Disk Drive (HDD).

The control unit 2212 may analyze and process a signal SGL received from the host device 2100. The control unit 2212 may control operations of internal function blocks according to firmware or software for operating the SSD 2200. The random access memory 2213 may be used as a working memory for executing such firmware or software.

The ECC unit 2214 may generate parity data of data to be transmitted to the nonvolatile memories 2231 to 223$n$. The generated parity data along with the data may be stored in the nonvolatile memories 2231 to 223$n$. The ECC unit 2214 may detect an error in data read from the nonvolatile memories 2231 to 223$n$, based on the parity data. When the detected error falls within a correctable range, the ECC unit 2214 may correct the detected error.

The memory interface unit 2215 may provide a control signal such as a command and an address to the nonvolatile memories 2231 to 223$n$ under the control of the control unit 2212. The memory interface unit 2215 may exchange data with the nonvolatile memories 2231 to 223$n$ under the control of the control unit 2212. For example, the memory interface unit 2215 may provide data stored in the buffer memory device 2220 to the nonvolatile memories 2231 to 223$n$, or provide data read from the nonvolatile memories 2231 to 223$n$ to the buffer memory device 2220.

Figure 17:
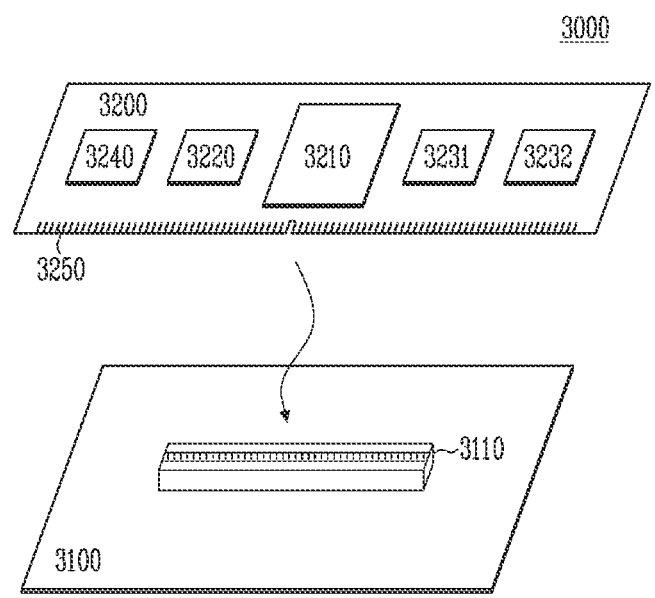
FIG. 17 is a diagram illustrating a data processing system including a data storage device in accordance with an embodiment of the present disclosure.

FIG. 17 is a diagram illustrating a data processing system 3000 including a data storage device in accordance with an embodiment of the present disclosure.

Referring to FIG. 17, the data processing system 3000 may include a host device 3100 and a data storage device 3200.

The host device 3100 may be configured in the form of a board, such as a printed circuit board. Although not shown in the drawing, the host device 3100 may include internal function blocks for performing the function of the host device.

The host device 3100 may include a connection terminal 3110 such as a socket, a slot, or a connector. The data storage device 3200 may be mounted on or in the connection terminal 3110.

The data storage device 3200 may be configured in the form of a board such as a printed circuit board. The data storage device 3200 may be referred to as a memory module or a memory card. The data storage device 3200 may include a controller 3210, a buffer memory device 3220, nonvolatile memories 3231 and 3232, a Power Management Integrated Circuit (PMIC) 3240, and a connection terminal 3250.

The controller 3210 may control overall operations of the data storage device 3200. The controller 3210 may be configured identically to the controller 2210 shown in FIG. 15.

The buffer memory device 3220 may temporarily store data to be stored in the nonvolatile memories 3231 and 3232. The buffer memory device 3220 may temporarily store data read from the nonvolatile memories 3231 and 3232. The data temporarily stored in the buffer memory device 3220 may be transmitted to the host device 3100 or the nonvolatile memories 3231 and 3232 under the control of the controller 3210.

The nonvolatile memories 3231 and 3232 may be used as storage media of the data storage device 3200.

The PMIC 3240 may provide power inputted through the connection terminal 3250 to the inside of the data storage device 3200. The PMIC 3240 may manage power of the data storage device 3200 under the control of the controller 3210.

The connection terminal 3250 may be connected to the connection terminal 3110 of the host device 3100. Through the connection terminal 3250, power and signals such as commands, addresses and data may be transferred between the host device 3100 and the data storage device 3200. The connection terminal 3250 may be configured in various forms according to an interface method between the host device 3100 and the data storage device 3200. The connection terminal 3250 may be disposed on any one side of the data storage device 3200.

Figure 18:
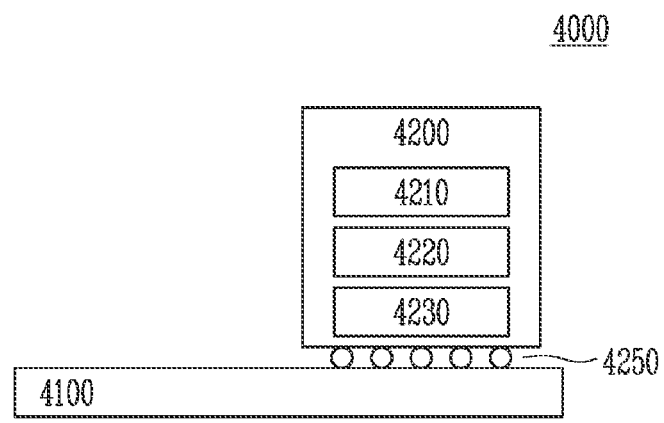
FIG. 18 is a diagram illustrating a data processing system including a data storage device in accordance with an embodiment of the present disclosure.

FIG. 18 is a diagram illustrating a data processing system 4000 including a data storage device in accordance with an embodiment of the present disclosure.

Referring to FIG. 18, the data processing system 4000 may include a host device 4100 and a data storage device 4200.

The host device 4100 may be configured in the form of a board such as a printed circuit board. Although not shown in the drawing, the host device 4100 may include internal function blocks for performing the function of the host device.

The data storage device 4200 may be configured in the form of a surface mounted package. The data storage device 4200 may be mounted on the host device 4100 through solder balls 4250. The data storage device 4200 may include a controller 4210, a buffer memory device 4220, and a nonvolatile memory 4230.

The controller 4210 may control overall operations of the data storage device 4200. The controller 4210 may be configured identically to the controller 2210 illustrated in FIG. 15.

The buffer memory device 4220 may temporarily store data to be stored in the nonvolatile memory 4230. The buffer memory device 4220 may temporarily store data read from the nonvolatile memory 4230. The data temporarily stored in the buffer memory device 4220 may be transmitted to the host device 4100 or the nonvolatile memory 4230 under the control of the controller 4210.

The nonvolatile memory 4230 may be used as a storage medium of the data storage device 4200.

Figure 19:
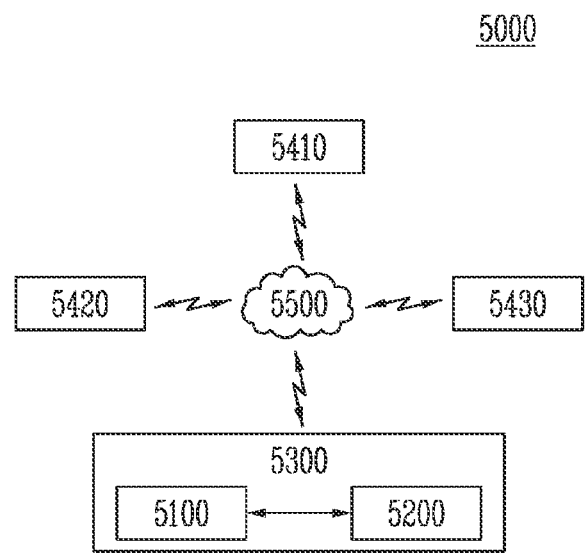
FIG. 19 is a diagram illustrating a network system including a data storage device in accordance with an embodiment of the present disclosure.

FIG. 19 is a diagram illustrating a network system 5000 including a data storage device in accordance with an embodiment of the present disclosure.

Referring to FIG. 19, the network system 5000 may include a server system 5300 and a plurality of client systems 5410 to 5430, which are connected to each other through a network 5500.

The server system 5300 may service data in response to requests of the plurality of client systems 5410 to 5430. For example, the server system 5300 may store data provided from the plurality of client systems 5410 to 5430. In another example, the server system 5300 may provide data to the plurality of client systems 5410 to 5430.

The server system 5300 may include a host device 5100 and a data storage device 5200. The data storage device 5200 may be configured as at least one of the storage device 50 shown in FIG. 1, the SSD 2200 shown in FIG. 15, the data storage device 3200 shown in FIG. 17, and the data storage device 4200 shown in FIG. 18.

In accordance with the present disclosure, provided is a memory device having an improved operation speed, and an operating method of the memory device.

While the present disclosure has been shown and described with reference to certain embodiments thereof, it will be understood by those skilled in the art that various changes in form and detail may be made therein without departing from the spirit and scope of the present disclosure as defined by the appended claims and their equivalents. Therefore, the scope of the present disclosure should not be limited to the above-described embodiments but should be determined by not only the appended claims but also the equivalents thereof.

In the above-described embodiments, all steps may be selectively performed or one or more steps may be omitted. In each embodiment, the steps are not necessarily performed in accordance with the described order and may be rearranged. The embodiments disclosed in this specification and drawings are only examples to facilitate an understanding of the present disclosure, and the present disclosure is not limited thereto. That is, it should be apparent to those skilled in the art that various modifications can be made on the basis of the technological scope of the present disclosure.

Meanwhile, the embodiments of the present disclosure have been illustrated and described in the drawings and specification. Although specific terminologies are used here, those are only to explain the embodiments of the present disclosure. Therefore, the present disclosure is not restricted to the above-described embodiments and many variations are possible within the spirit and scope of the present disclosure. It should be apparent to those skilled in the art that various modifications can be made on the basis of the technological scope of the present disclosure in addition to the embodiments disclosed herein.

What is claimed is:

1. A memory device comprising:
   a memory block including memory cells;
   a peripheral circuit configured to perform a program operation including a plurality of program loops each including a program pulse application operation of increasing threshold voltages of the memory cells and a verify operation of verifying whether the threshold voltages of the memory cells have reached a target threshold voltage; and
   control logic configured to control the peripheral circuit to perform the program operation,
   wherein the peripheral circuit outputs a verify pass signal, corresponding to that a number of memory cells for which the threshold voltages have reached the target threshold voltage among the memory cells is equal to or greater than that determined by a verify pass reference, and
   wherein the control logic:
      sets the verify pass reference such that the verify pass signal is output at an (N−2)th program loop performed before an Nth program loop in which the threshold voltages of the memory cells have reached the target threshold voltage;
      stores cell status information representing a program state of each of the memory cells, corresponding to a verify operation included in the (N−2)th program loop; and
      applies a program limit voltage to each bit line of the memory cells in a program pulse application operation of each of an (N−1)th program loop and the Nth program loop, based on the stored cell status information,
      wherein a number determined by the verify pass reference is less than the number of memory cells for which the threshold voltages have reached the target threshold voltage in the Nth program loop.

2. The memory device of claim 1, wherein the cell status information is information representing that each of the memory cells corresponds to any one cell state among:
   a program cell state representing that threshold voltages of the memory cells are lower than a predetermined auxiliary verify voltage;
   a double program cell state representing that the threshold voltages of the memory cells are equal to or higher than the auxiliary verify voltage and are lower than a predetermined main verify voltage; and a program inhibit cell state representing that the threshold voltages of the memory cells are equal to or higher than the main verify voltage.

3. The memory device of claim 2, wherein the control logic controls the peripheral circuit to:

apply a ground voltage to each bit line of memory cells corresponding to the program cell state among the memory cells;

apply a program allow voltage to each bit line of memory cells corresponding to the double program cell state among the memory cells; and apply a program inhibit voltage to each bit line of memory cells corresponding to the program inhibit cell state among the memory cells.

4. The memory device of claim 3, wherein the control logic further includes a cell status information changing component configured to control the peripheral circuit to:

change a program state of memory cells corresponding to the double program cell state included in the stored cell status information to the program inhibit cell state; and change a program state of memory cells corresponding to the program cell state to the double program cell state, corresponding to the program pulse application operation included in the (N−1)th program loop as a next program loop of the (N−2)th program loop in which the verify pass signal is received.

5. The memory device of claim 4, wherein the control logic controls the peripheral circuit to apply the program limit voltage to the bit line of the memory cells according to the cell status information changed by the cell status information changing component, when the program pulse application operation is included in the Nth program loop.

6. The memory device of claim 5, wherein the control logic controls the peripheral circuit to omit the verify operation in the (N−1)th program loop and the Nth program loop.

7. The memory device of claim 3, wherein the control logic controls the peripheral circuit to:

apply the program inhibit voltage to a bit line of memory cells for which the program state is indicated as the double program cell state by the cell status information among the memory cells; and apply the program allow voltage to a bit line of memory cells for which the program state is indicated as the program cell state by the cell status information, in the program pulse application operation included in the Nth program loop.

8. A memory device comprising:

a memory block including memory cells;

a peripheral circuit configured to perform a program operation including a plurality of program loops, wherein each of the plurality of program loops includes a program pulse application operation of increasing threshold voltages of the memory cells by applying a program pulse and a verify operation of verifying whether the threshold voltages of the memory cells have reached a target threshold voltage; and control logic configured to control the peripheral circuit to store cell status information representing a program state of each of the memory cells, corresponding to the verify operation, and apply a program limit voltage to each bit line of the memory cells according to the cell status information in the program pulse application operation, wherein the control logic:

sets a verify pass reference such that a verify pass signal of the verify operation is output at a first program loop performed before two program loops than a second program loop in which the threshold voltages of the memory cells have reached the target threshold voltage; and applies the program limit voltage determined based on the cell status information stored when the verify pass signal is received at each bit line of the memory cells from a next program loop of a program loop in which the verify pass signal is received to a program loop in which the threshold voltages of the memory cells reach the target threshold voltage, wherein a number of memory cells whose threshold voltages reach the target threshold voltage in the first program loop is less than a number of memory cells whose threshold voltages reach the target threshold voltage in the second program loop.

9. The memory device of claim 8, wherein the cell status information is information representing that each of the memory cells corresponds to any one cell state among:

a program cell state representing that threshold voltages of the memory cells are lower than a predetermined auxiliary verify voltage;

a double program cell state representing that the threshold voltages of the memory cells are equal to or higher than the auxiliary verify voltage and is lower than a predetermined main verify voltage; and a program inhibit cell state representing that the threshold voltages of the memory cells are equal to or higher than the main verify voltage.

10. The memory device of claim 9, wherein the program limit voltage includes:

a ground voltage corresponding to the program cell state;

a program allow voltage corresponding to the double program cell state; and a program inhibit voltage corresponding to the program inhibit cell state.

11. The memory device of claim 10, wherein the control logic further includes a cell status information changing component configured to control the peripheral circuit to:

change a program state of memory cells corresponding to the double program cell state included in the cell status information stored when the verify pass signal is received to the program inhibit cell state; and change a program state of memory cells corresponding to the program cell state to the double program cell state, corresponding to a first pulse application operation included in the next program loop of the program loop in which the verify pass signal is received.

12. The memory device of claim 11, wherein the control logic controls the peripheral circuit to apply the program limit voltage to the bit line of the memory cells according to the cell status information changed by the cell status information changing component, when a second pulse operation application included in a next program loop of the program loop including the first pulse application operation is performed.

13. The memory device of claim 12, wherein the control logic controls the peripheral circuit to omit the verify operation in the program loop including the first pulse application operation and the program loop including the second pulse application operation.

14. The memory device of claim 10, wherein the control logic controls the peripheral circuit to:
  apply the program inhibit voltage to a bit line of memory cells for which the program state is indicated as the double program cell state by the cell status information stored when the verify pass signal is received among the memory cells; and
  apply the program allow voltage to a bit line of memory cells for which the program state is indicated as the program cell state, in a program pulse application operation included in a program loop performed secondly from the program loop in which the verify pass signal of the verify operation is received.

15. The memory device of claim 10, wherein the verify pass reference is set such that a number of memory cells corresponding to the program cell state among the memory cells is fewer than a predetermined number.

16. A method for operating a memory device including a memory block including memory cells, a peripheral circuit for performing a program operation including a plurality of program loops, and control logic for controlling the peripheral circuit to apply a program limit voltage to each bit line of the memory cells, corresponding to the program operation,
  wherein each of the plurality of program loops includes a program pulse application operation of increasing threshold voltages of the memory cells and a verify operation of verifying whether the threshold voltages of the memory cells have reached a target threshold voltage, and
  wherein the method comprises:
  setting a verify pass reference such that a verify pass signal of the verify operation is output at an (N−2)th program loop performed before an Nth program loop in which the threshold voltages of the memory cells have reached the target threshold voltage;
  storing cell status information representing a program state of each of the memory cells, corresponding to a verify operation included in the (N−2)th program loop; and
  applying a program limit voltage to each bit line of the memory cells in a program pulse application operation of each of an (N−1)th program loop and the Nth program loop, based on the stored cell status information,
  wherein a number determined by the verify pass reference is less than a number of memory cells for which the threshold voltages have reached the target threshold voltage in the Nth program loop.

17. The method of claim 16, wherein applying the program limit voltage includes:
  applying the program limit voltage in the program pulse application operation included in the (N−1)th program loop according to the cell status information;
  changing the cell status information; and
  applying the program limit voltage in the program pulse application operation included in the Nth program loop according to the changed cell status information.

18. The method of claim 17, wherein applying the program limit voltage in the program pulse application operation included in the (N−1)th program loop comprises:
  applying a ground voltage to a bit line of memory cells corresponding to a program cell state representing that threshold voltages are lower than a predetermined auxiliary verify voltage among the memory cells;
  applying a program allow voltage to a bit line of memory cells corresponding to a double program cell state representing that the threshold voltages are equal to or higher than the auxiliary verify voltage and are lower than a predetermined main verify voltage among the memory cells; and
  applying a program inhibit voltage to a bit line of memory cells corresponding to a program inhibit cell state representing that the threshold voltages are higher than the main verify voltage among the memory cells.

19. The method of claim 18, wherein changing the cell status information comprises:
  changing the cell status information of memory cells for which the program state is the double program cell state among the memory cells to the program inhibit cell state; and
  changing the cell status information of memory cells for which the program state is the program cell state among the memory cells to the double program cell state.

20. The method of claim 19, wherein applying the program limit voltage in the program pulse application operation included in the Nth program loop comprises:
  applying the program allow voltage corresponding to the double program cell state, based on the changed cell status information; and
  applying the program inhibit voltage corresponding to the program inhibit cell state, based on the changed cell status information.

* * * * *